United States Patent [19]
Saito

[11] Patent Number: 5,138,421
[45] Date of Patent: Aug. 11, 1992

[54] SEMICONDUCTOR SUBSTRATE AND METHOD OF PRODUCING THE SAME, AND SEMICONDUCTOR DEVICE

[75] Inventor: Yoshihiko Saito, Yokosuka, Japan
[73] Assignee: Kabushiki Kaisha Toshiba, Kawasaki, Japan
[21] Appl. No.: 600,545
[22] Filed: Oct. 16, 1990
[30] Foreign Application Priority Data
  Oct. 18, 1989 [JP] Japan .................. 1-269212
[51] Int. Cl.⁵ .............. H01L 27/12; H01L 29/04; H01L 45/00; H01L 29/72
[52] U.S. Cl. ........................ 357/49; 357/59; 357/2; 357/34
[58] Field of Search ............ 357/49, 59, 2, 34, 55

[56] References Cited
U.S. PATENT DOCUMENTS
4,987,471  1/1991  Easter et al. ............ 357/49

Primary Examiner—Mark V. Prenty
Attorney, Agent, or Firm—Finnegan, Henderson, Farabow, Garrett and Dunner

[57] ABSTRACT

The semiconductor substrate according to the present invention comprises a first semiconductor layer, an insulation layer formed on said first semiconductor layer, a buffer layer formed on said insulation layer having at least one of getter ability and layer distortion buffering ability, and a second semiconductor layer formed on said buffer layer.

4 Claims, 8 Drawing Sheets

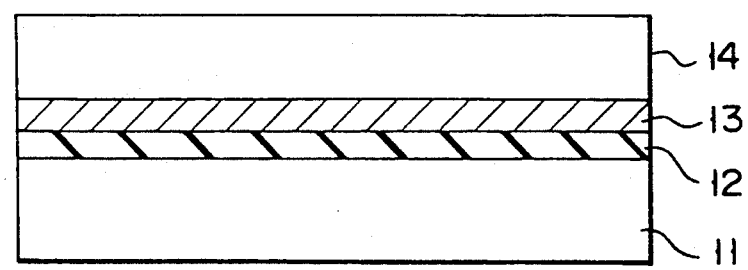
F I G. 5

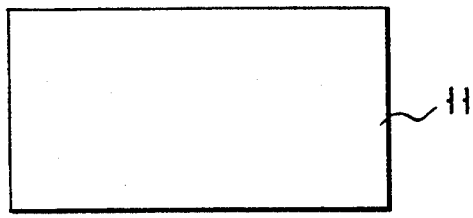
F I G. 6A
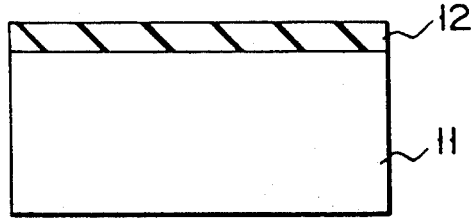
F I G. 6B
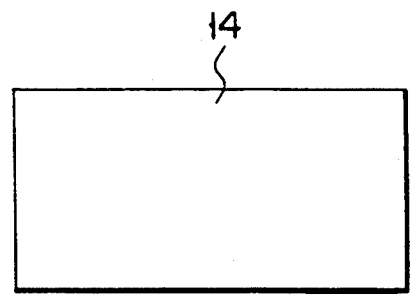
↓ ADHESION
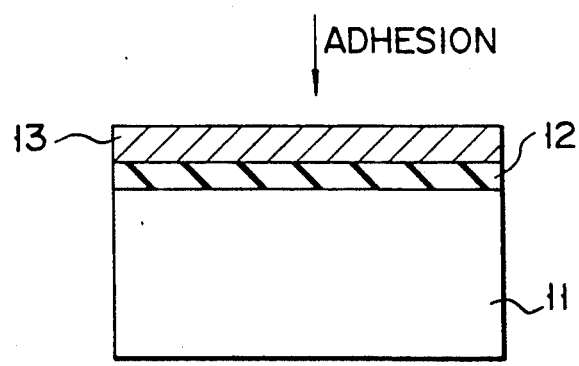
F I G. 6C

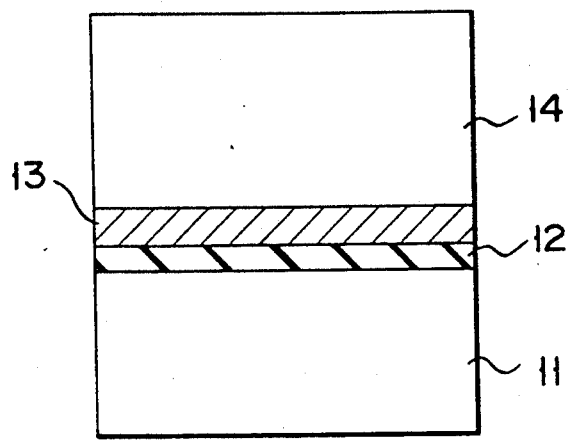
F I G. 6D
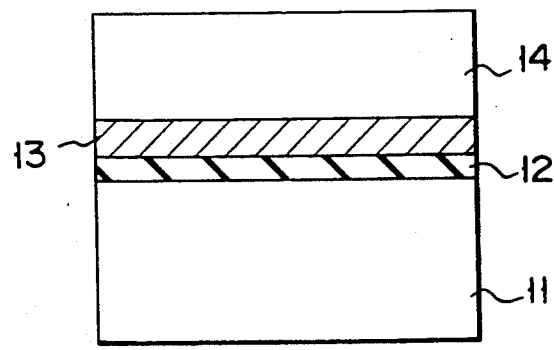
F I G. 6E

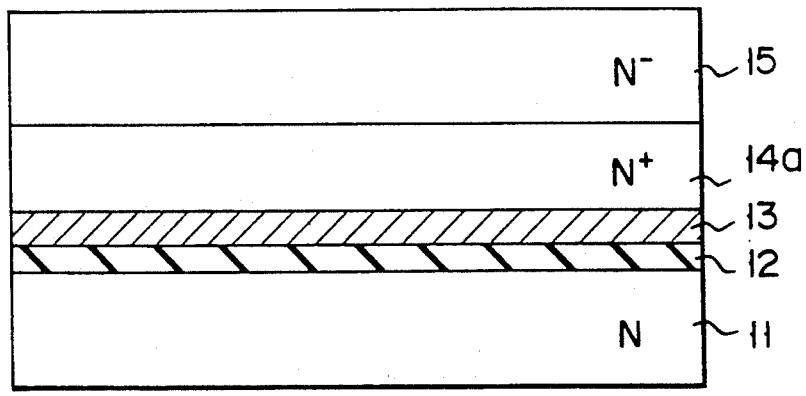
F I G. 7
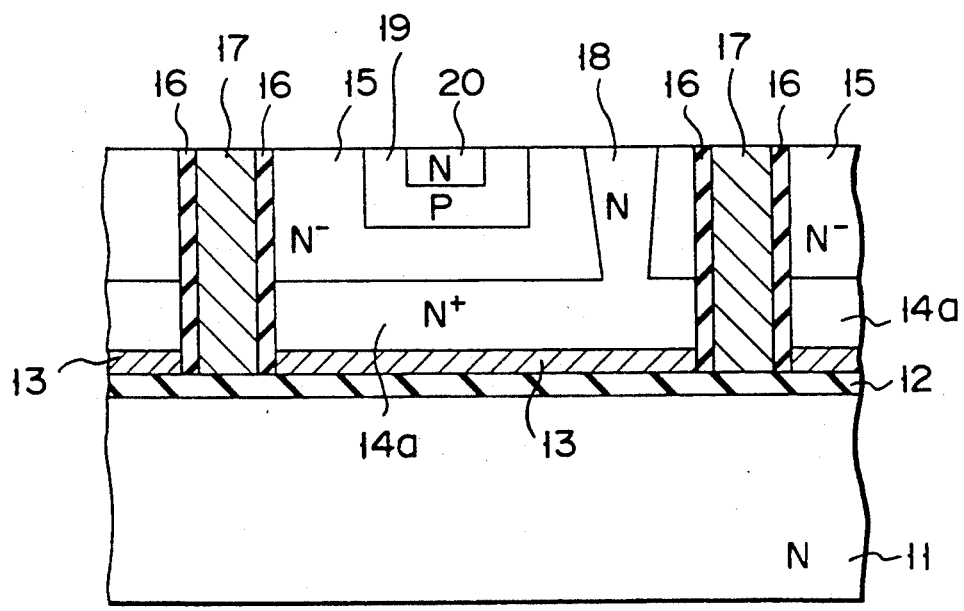
F I G. 8

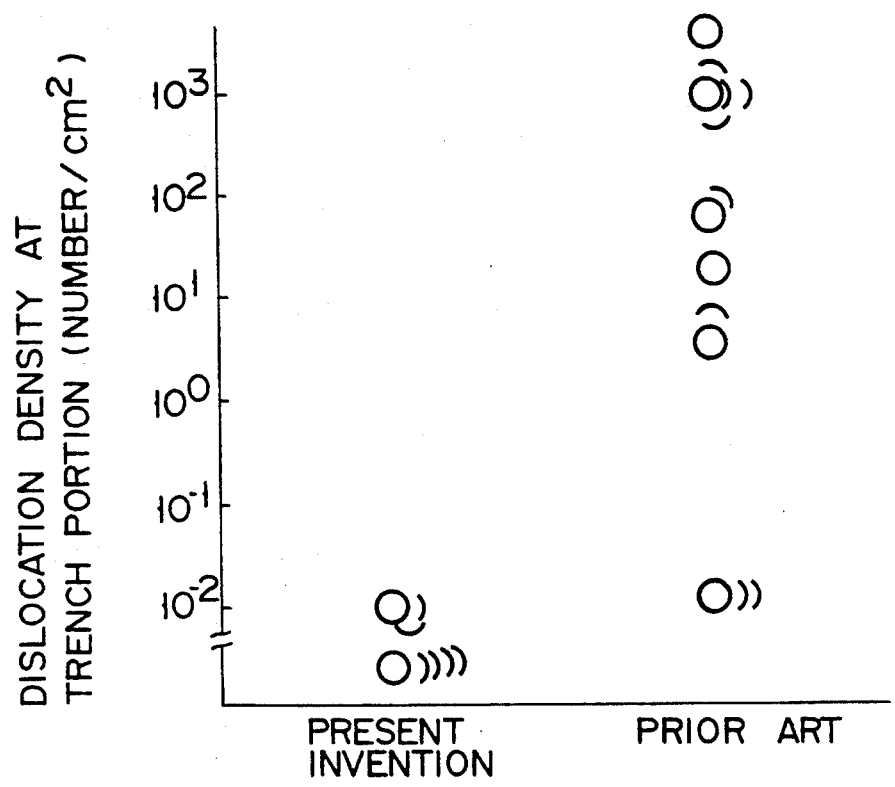
F I G. 9

SEMICONDUCTOR SUBSTRATE AND METHOD OF PRODUCING THE SAME, AND SEMICONDUCTOR DEVICE

BACKGROUND OF THE INVENTION

1. Field of the Invention

The present invention relates to a semiconductor substrate, in particular, one having a dielectrically isolated structure, and to a method of producing the same, as well as to the remodeling of a semiconductor device.

2. Description of the Related Art

A dielectrically isolated type semiconductor device is known, which comprises, as shown in FIG. 1, a silicon monocrystal wafer 1, a silicon oxide layer 2, a silicon monocrystal layer (or wafer) 3, a silicon oxide layer 4, a polysilicon layer 5, an N-type silicon layer 6, an N-type impurity diffusion layer 7, a P-type impurity diffusion layer 8, and an N-type impurity diffusion layer 9.

Some methods of producing a semiconductor substrate used in a dielectrically-isolated type semiconductor device will be described.

FIG. 2 illustrates the melt recrystallization method. In this method, a silicon oxide layer 2 is formed on a silicon monocrystallization wafer 1, and a polycrystal silicon (or amorphous silicon) layer 3 is formed on the silicon oxide layer 2. Thereafter, the surface of the layer 3 is scanned with a laser beam or an electron beam at high speed, so as to subsequently grow the solid-phase of the silicon layer.

FIG. 3 shows the SIMOX (separation by implanted oxygen method. In this method, oxygen ions ($^{16}O^+$ or $^{32}O_2^+$) are implanted into the silicon monocrystal wafer 1, forming a silicon oxide layer 2 therein. Thus, the substrate and the silicon oxide layer are isolated by means of the dielectric layer. Then, the wafer is annealed at high temperature, removing the defects caused in the process of ion implantation. Further, the thickness of the silicon layer formed on the silicon oxide layer 2 can be adjusted by carrying out epitaxial growth.

FIGS. 4A to 4E illustrate some of the methods of producing a wafer by means of adhesion. As shown in FIGS. 4A and 4B, the surface of the silicon monocrystal wafer 1 is oxidized by heat so as to form the silicon oxide layer 2. Then, as is shown in FIGS. 4C and 4D, another silicon monocrystal wafer 3 is adhered to the silicon oxide layer 2, and the surface of the silicon monocrystal wafer 3 is abraded until the thickness thereof becomes appropriate.

However, these methods have the following problems.

In the melt recrystallization method shown in FIG. 2, the silicon layer (activated layer) formed by recrystallization of the polycrystallization silicon (or amorphous silicon) layer 3 has an insufficient crystallizability. Therefore, a wafer including such a silicon layer cannot be used for a highly integrated device.

In the SIMOX method shown in FIG. 3, due to the ion implantation performed, the silicon layer (activated layer) exhibits insufficient crystallizability. Further, when carrying out the epitaxial growth, defects in the wafer affect the silicon layer (activated layer) and deteriorate its crystallizability. Therefore, a wafer including such a silicon layer cannot be used for a highly integrated device.

The methods of producing wafers by means of adhesion shown in FIGS. 4A to 4E are free of the problems inherent in the above two methods. In other words, wafers prepared by these methods (FIGS. 4A to 4E) have activated layers exhibiting crystallizabilities similar to those of regular mirror wafers. However, the silicon monocrystal wafer 3 on the activated layer side is likely to be damaged in certain steps of production such as the trenching step and the LOCOS step. Further, the silicon monocrystalline wafer 1 does not have enough getter ability, and the activated layer has crystallization defects such as dislocation and OSF (Oxidation-induced Stacking Fault) may result in the activated layer. Thus, it is very difficult to achieve stable mass-production of the device.

SUMMARY OF THE INVENTION

The purpose of the present invention is to provide a semiconductor substrate of the dielectrically-isolated type, and a production method for the same, as well as a semiconductor apparatus, all of which contribute to stable mass-production of integrated devices. Such a purpose can be achieved by solving the above-mentioned problems, i.e. the activated layer having insufficient crystallizability, and crystal defects such as dislocations and OSF resulting in an activated layer in the course of the production method of a wafer by adhesion.

In order to achieve the above-mentioned purpose:

the first aspect of the present invention is to provide a semiconductor substrate which comprises a first semiconductor layer, an insulation layer formed on said first semiconductor layer, a buffer layer formed on said insulation layer having at least one of getter ability and a layer distortion buffering ability, and a second semiconductor layer formed on said buffer layer;

the second aspect of the present invention is to provide a semiconductor substrate comprising a first semiconductor layer, an insulation layer formed on said first semiconductor layer, a buffer layer formed on said insulation layer having at least one of getter ability and a layer distortion buffering ability, a second semiconductor layer formed on said buffer layer, and a third semiconductor layer formed on said second semiconductor layer, with the third semiconductor layer being of a conductivity type identical to that of said second semiconductor layer and having a dopant concentration lower than that of said second semiconductor layer;

the third aspect of the present invention is to provide a semiconductor substrate comprising a first semiconductor layer, an insulation layer formed on said first semiconductor layer, a buffer layer formed on said insulation layer having at least one of getter ability and a layer distortion buffering ability, a second semiconductor layer formed on said buffer layer, a third semiconductor layer formed on said second semiconductor layer, with the third semiconductor layer being of a conductivity type identical to that of said second semiconductor layer and having a dopant concentration lower than that of said second semiconductor layer, and a semiconductor element formed on said third semiconductor layer; and the fourth aspect of the present invention is to provide a method of producing a semiconductor substrate comprising steps of forming a insulation layer on a first wafer, forming a buffer layer containing at least one of getter ability and a layer distortion buffering ability on said insulation layer, and adhering a second wafer onto said buffer layer by a wafer adhesion technique.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a cross section of a semiconductor substrate having the dielectrically-isolated structure according to an embodiment of the present invention;

FIGS. 6A–6E show cross-sections of a semiconductor substrate in stages of the production method of a semiconductor having the dielectrically-isolated structure according to an embodiment of the present invention;

FIG. 7 is a cross-section of a semiconductor substrate having the dielectrically-isolated structure according to another embodiment of the present invention;

FIG. 8 is a cross-section of a semiconductor device in which a bipolar device is formed on the semiconductor shown in FIG. 7; and FIG. 9 is a graph comparing the dislocation densities at the trench portions of semiconductor devices prepared by means of the semiconductor substrates according to both the present invention and the conventional technique.

DETAILED DESCRIPTION OF THE PREFERRED EMBODIMENTS

Figure 1:
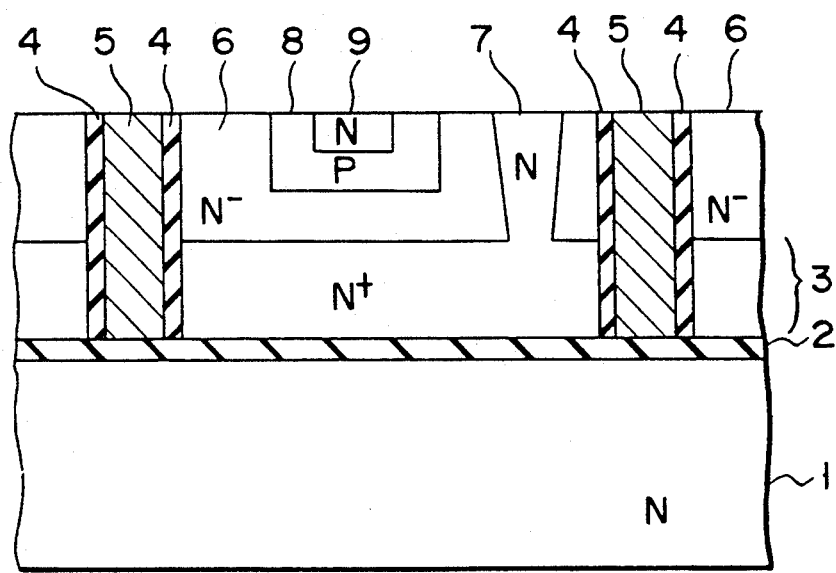
FIG. 1 is a cross-sectional view of a semiconductor device having the conventional dielectrically isolated structure.
Figure 2:
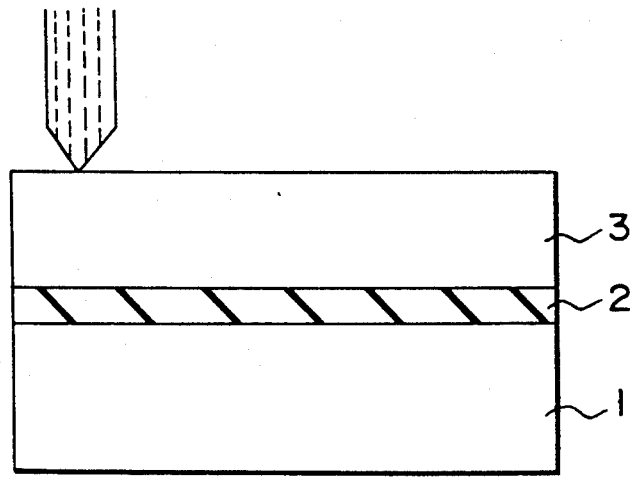
FIG. 2 to FIG. 4E show cross sections of semiconductor substrates in stages of the production method of a semiconductor having the conventional dielectrically-isolated structure.
Figure 3:
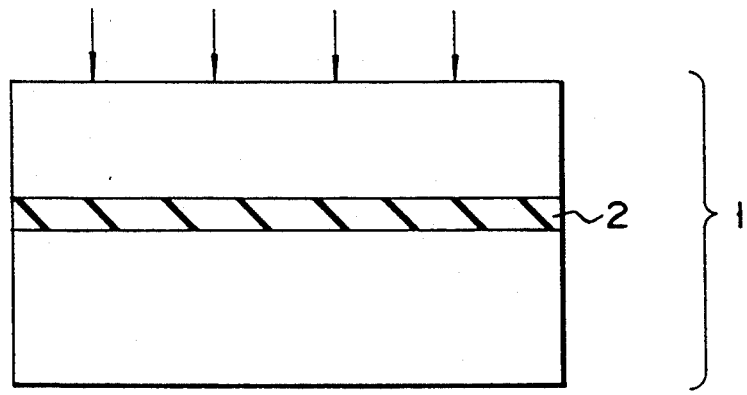
Figure 4A:
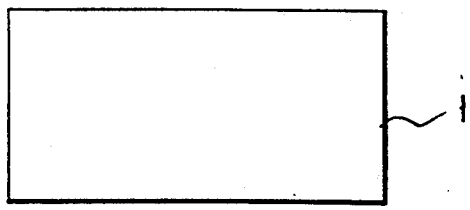
Figure 4B:
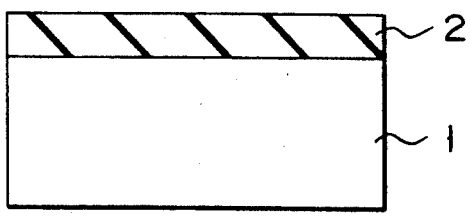
Figure 4C:
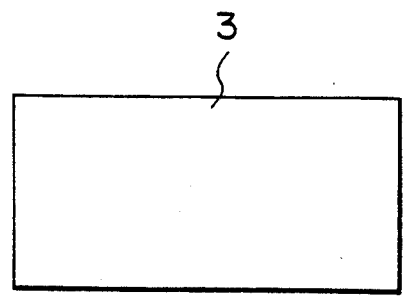
Figure 4C:
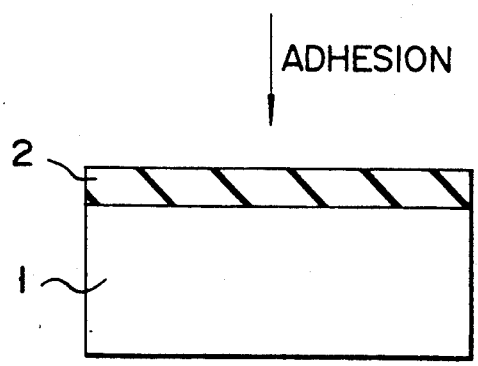
Figure 4D:
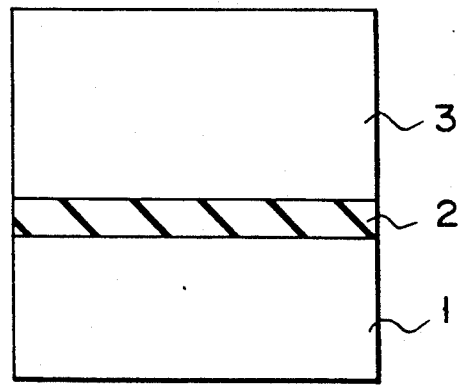
Figure 4E:
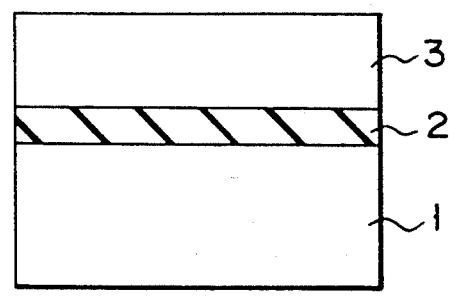

The invention will now be further described, with reference to the accompanying drawings wherein like reference numerals designate like items, and repetition of explanation of an item will be avoided.

FIG. 5 shows a semiconductor substrate having the dielectrically-isolated structure according to an embodiment of the present invention.

A silicon oxidation layer (insulation layer) 12 is formed on a silicon monocrystal wafer (the first semiconductor layer) 11, and a buffer layer 13 is formed on the silicon oxidation layer 12. The buffer layer 13 is made of a material having getter ability and a film distortion buffering ability, for example, polysilicon. Further, a silicon monocrystal wafer (the second semiconductor layer) 14 is formed on the buffer layer 13.

The material for the buffer layer 13 can be anything if it has the getter ability and the film distortion buffering ability. Besides polysilicon, which was mentioned above, amorphous silicon, silicon nitride, or a lamination layer made of these can be used as its material.

FIGS. 6A–6E illustrate cross section of a semiconductor substrate in stages of the production method of a semiconductor having the dielectrically-isolated type according to an embodiment of the present invention. In this embodiment, the wafer adhesion method is used for forming the semiconductor substrate.

First, for example, the mirror-polished N-type silicon monocrystal wafer 11 having the crystal line orientation (100) is oxidized. The silicon oxidation layer 12 having the thickness of about 1 $\mu$m is formed on the surface of the mirror-polished wafer 11 (see polysilicon layer) 13 having the thickness of about 1 $\mu$m is deposited on the silicon oxidation layer 12. Next, the mirror-polished N-type silicon monocrystal wafer 14 having the crystal line orientation (100) is adhered onto the buffer layer 13. In detail, they are adhered together in the atmosphere so that the mirror-surfaces of the wafers 11 and 14 meet, i.e. the silicon oxidation layer 12 and buffer layer 13 are sandwiched between the wafers 11 and 14. Further, in order to strengthen adhesion between the wafers 11 and 14, a heat processing is carried out in a gas atmosphere (volume ratio $N_2/O_2 = 4/1$) at about 1,100° for 2 hours (FIGS. 6C and 6D). Then, the adhered wafer 14 is processed and polished by means of a grinder for a desired thickness, for example 20 resistivity, orientation, and shape), so as to complete a semiconductor substrate according to the present invention (see FIG. 6E).

In the meantime, the thickness of the above-mentioned buffer layer 13 can be appropriately determined in consideration of conditions for the heat processing, etc. in the actual production steps. Further, polysilicon, amorphous silicon, silicon nitride, or multi-layer thereof can be used for the buffer layer 13. When polysilicon is used for the buffer layer 13, the grain size thereof should pre-ferably be the one with which the irregularity of the surface after depositing polysilicon is 500 Å or less. Moreover, the getter effect, and the distortion buffering effect between the silicon oxidation layer 12 and the wafer 14, etc. may vary with the grain size of the polysilicon used. In this case, the two wafers 11 and 14 should be adhered with each other after carrying out mirror-surface process to the polysilicon in accordance with necessity.

FIG. 7 illustrates a semiconductor substrate having a dielectrically-isolated structure according to another embodiment of the present invention.

A silicon oxide layer (insulation layer) 12 is formed on an N-type silicon monocrystal wafer (the first semiconductor layer) 11, and a buffer layer (for example, polysilicon layer) 13 having getter ability and film distortion buffering ability is formed on a silicon oxidation layer 12. Further, a high concentration N+ type silicon layer (or wafer) 14a, which functions as an active layer of the device, is formed on the buffer layer 13, and a low concentration N− silicon layer (the third semiconductor layer) 15 is formed on the high concentration N+ type silicon layer (the second semiconductor layer) 14a.

Of course, polysilicon, amorphous silicon, silicon nitride, or multi-layer thereof can be used for the buffer layer 13.

Meanwhile, the production method of a semiconductor shown in FIG. 7 is as follows:

First, a semiconductor substrate shown in the series of FIGS. 6 is prepared by the method illustrated in these figures. Then, N-type impurities are introduced to the wafer 14 by using, for example, the diffusion method to form a high concentration N+-type silicon layer 14a. Further, a low concentration N−-type silicon is formed on the high concentration N+-type silicon layer 14a by, for example, an epitaxial growth method.

FIG. 8 illustrates a semiconductor device in which a bipolar device is formed on the semiconductor shown in FIG. 7. In this figure, reference numeral 11 denotes a silicon monocrystal wafer, numeral 12, a silicon oxidation layer, numeral 13, a buffer layer, numeral 14a, an N+-type silicon layer, numeral 15, an N− silicon layer, numeral 16, a silicon oxidation layer, numeral 17, polysilicon layer, numeral 18, an N-type impurity diffusion layer, numeral 19, a P-type impurity diffusion layer, and numeral 20, an N-type impurity diffusion layer.

With the semiconductor device prepared using the semiconductor substrate shown in FIG. 7, crystal defects such as dislocations and OSF which occur in processes such as the trench step, LOCOS step, can be suppressed, and therefore a stable mass-production of the device becomes possible.

FIG. 9 shows the results of a test for investigating dislocation density [member/cm$^2$] at the trench portion with respect to semiconductor devices prepared in the same process but using the semiconductor substrates by the present invention and conventional technique.

The results of this test show that the semiconductor device (the conventional products) prepared by using the conventional semiconductor substrate has a number of dislocations at the trench portion, whereas the number of dislocations at the trench portion in the semiconductor device (the present invention) prepared by using the substrate of the present invention is suppressed. Thus, a stable and high yield of the device can be obtained.

In addition, the explanations of the embodiments include only the case of the N-type semiconductor substrate. Of course, however, the present invention can be applied also to the P-type semiconductor substrate.

Additional advantages and modifications will readily occur to those skilled in the art. Therefore, the invention in its broader aspects is not limited to the specific details, representative devices, and illustrated examples shown and described herein. Accordingly, various modifications may be without departing from the spirit or scope of the general inventive concept as defined by the appended claims and their equivalents.

What is claimed is:

1. A semiconductor apparatus comprising:
   a first semiconductor layer;
   a first insulation layer formed on said first semiconductor layer;
   a buffer layer containing at least one of polycrystalline silicon, amorphous silicon and silicon nitride formed on said first insulative layer having at least one of gettering ability and buffering ability;
   a second semiconductor layer formed on said buffer layer;
   a third semiconductor layer formed on said second semiconductor layer, being of a conductivity type identical to that of said second semiconductor layer and having a dopant concentration lower than that of said second semiconductor layer;
   a trench formed in said second and third semiconductor layers and surrounding an element region;
   a second insulation layer formed on a side wall of said trench;
   a polysilicon layer formed in said trench; and
   a semiconductor element formed in said element region.

2. A semiconductor device according to claim 1, wherein said first semiconductor layer is a monocrystalline silicon wafer.

3. A semiconductor device according to claim 1, wherein said second semiconductor layer is a monocrystalline silicon wafer.

4. A semiconductor device according to claim 1, wherein said semiconductor element is a bipolar transistor.

* * * * *